United States Patent [19]

Goodin et al.

[11] Patent Number: 5,194,365

[45] Date of Patent: Mar. 16, 1993

[54] METHOD FOR FORMING IMAGES

[75] Inventors: Jonathan W. Goodin, Neu-Isenburg, Fed. Rep. of Germany; Edward Irving, Burwell; Christopher P. Banks, Saffron Walden, both of England

[73] Assignee: Ciba-Geigy Corporation, Ardsley, N.Y.

[21] Appl. No.: 369,000

[22] Filed: Jun. 14, 1989

Related U.S. Application Data

[63] Continuation of Ser. No. 136,531, Dec. 12, 1987, abandoned, which is a continuation of Ser. No. 876,040, Jun. 19, 1986, abandoned.

[30] Foreign Application Priority Data

Jun. 19, 1985 [GB] United Kingdom ............... 8515475

[51] Int. Cl.$^5$ .............................................. G03C 5/00
[52] U.S. Cl. ................................... 430/327; 430/270; 430/325; 430/328; 430/330
[58] Field of Search ............... 430/327, 328, 325, 330, 430/270

[56] References Cited

U.S. PATENT DOCUMENTS

| | | |
|---|---|---|
| 4,058,400 | 11/1977 | Crivello . |
| 4,058,401 | 11/1977 | Crivello . |
| 4,182,665 | 1/1980 | Mibu et al. . |
| 4,291,118 | 9/1981 | Boduch et al. . |
| 4,299,938 | 11/1981 | Green et al. . |
| 4,339,567 | 7/1982 | Green et al. . |
| 4,383,025 | 5/1983 | Green et al. . |
| 4,413,052 | 11/1983 | Green et al. . |
| 4,416,975 | 11/1983 | Green et al. . |
| 4,426,431 | 1/1984 | Harasta et al. . |
| 4,428,807 | 1/1984 | Lee et al. . |
| 4,500,629 | 2/1985 | Irving et al. . |
| 4,518,676 | 5/1985 | Irving . |
| 4,528,261 | 7/1985 | Hauser ............... 430/327 |
| 4,544,627 | 10/1985 | Takahashi et al. ............... 430/328 |
| 4,546,067 | 10/1985 | Irving et al. ............... 430/327 |
| 4,548,891 | 10/1985 | Riediker et al. . |
| 4,572,890 | 2/1986 | Goodin et al. ............... 430/325 |
| 4,590,287 | 5/1986 | Riediker et al. . |

FOREIGN PATENT DOCUMENTS

| | | |
|---|---|---|
| 84-24454 | 8/1984 | Australia . |
| 1219810 | 1/1971 | United Kingdom . |
| 1479742 | 7/1977 | United Kingdom . |
| 1516352 | 7/1978 | United Kingdom . |
| 1565923 | 4/1980 | United Kingdom . |
| 2127714 | 4/1984 | United Kingdom . |

OTHER PUBLICATIONS

Derwent Abst. 84-296088/48.
Chemical Abst. 99, 96846y (1983).
Derwent Abst 85-312194/50.
J. V. Crivello et al, J. Polymer Sci, Poly. Chem, 21, 1785 (1983).

Primary Examiner—Jack P. Brammer
Attorney, Agent, or Firm—Luther A. R. Hall; Bruce M. Collins

[57] ABSTRACT

Images are formed by the following process:
(i) a substrate is treated with a layer of a liquid composition comprising
  (A) a residue that is polymerizable by means of free radicals, such as an acrylic ester,
  (B) a radiation-activated polymerization initiator for (A), such as a metallocene or a mixture of a Group IVA organometallic compound with a photoreducible dye.
  (C) a radiation-curable residue that is different from (A), such as an epoxide resin, and optionally
  (D) a radiation-activated catalyst for the cure of (C), such as an aromatic onium salt,
(ii) the composition is subjected to actinic radiation having a wavelength at which the initiator (B) is activated but at which the residue (C) and/or the catalyst (D) are not substantially activated, thereby polymerizing (A) such that the layer of liquid composition is solidified, but remains curable,
(iii) the solidified layer is subjected in a predetermined pattern to actinic radiation having a wavelength that is shorter than that of the radiation used in stage (ii) and at which the radiation-curable residue (C) and/or the catalyst (D) is activated, such that in the exposed areas (C) is substantially cured, and
(iv) removing areas of the solidified layer that have not been substantially cured.

17 Claims, No Drawings

METHOD FOR FORMING IMAGES

This application is a continuation of Ser. No. 07/136,531 filed Dec. 12, 1987 now abandoned which is a continuation of Ser. No. 06/876,040 filed Jun.19, 1986 now abandoned.

This invention relates to a method for forming images from liquid coatings on substrates by exposures to actinic radiation at different wavelengths.

Conventionally, production of an image by means of photopolymerisation is achieved by coating a support with a solution in a volatile organic solvent of a photopolymerisable substance, causing or allowing the solvent to evaporate so leaving a film of the photopolymerisable substance, irradiating the film with actinic radiation as through an image whereby the parts of the film struck by the irradiation become photopolymerised (and less soluble) while those parts shielded from the irradiation remain substantially unaffected, then dissolving away the unirradiated, unphotopolymerised parts of the film by means of a suitable solvent which does not dissolve the irradiated, photopolymerised parts. This last stage is conventionally known as "development".

It would be desirable to have a process in which a layer of a photopolymerisable substance were applied to a support and this layer were converted into a substantially solid, non-tacky state, ready for irradiation through an image, without the use of organic solvents. Not only would, in this stage, the use be avoided of solvents which might present problems of toxicity and flammability and also cause expense in their recovery, but production on a continuous basis of coated supports, ready for imagewise irradiation, would be facilitated.

We have found that this object can be achieved by the use, in liquid form, of certain mixtures of substances which contain either two or more materials, or at least one dual functional material, or both, that polymerise when exposed to actinic radiation but in which the two materials, or the two functions of the dual functional material, are sensitive at different wavelengths. Solidification is effected by exposure to actinic radiation at the longer wavelength to which the mixture is sensitive, giving a stable, solid, but still photosensitive layer. However, since the other radiation-sensitive material or function is only sensitive at a shorter wavelength, i.e. to actinic radiation of higher energy, prolonged exposure to radiation of higher wavelength, i.e. of lower energy, has a negligible effect on the solidified material. It may therefore be solidified at the higher wavelength without requiring very careful control over exposure times, and, following this, may be stored for prolonged periods, in the absence of radiation of the shorter wavelength. When desired, parts of the composition are exposed to the radiation of a shorter wavelength at which the composition is sensitive. Further polymerisation then occurs in the exposed areas, so that a difference in physical properties is caused between those areas receiving the second exposure and those not receiving the second exposure. Contact with a suitable solvent or other means of development removes the area receiving only one exposure and so a negative image is formed.

U.S. Pat. No. 4,291,118 describes a method for forming relief images from a film of a liquid photopolymerisable material, comprising solidifying the film by chemical hardening, usually by exposure to actinic radiation, then re-exposing the solidified film to actinic radiation in the form of a pattern so that parts of the film become chemically differentiated, and then selectively removing the portions of the film not exposed to the patterned exposure to actinic radiation by washing with a solvent.

There is no mention made of the possibility of using actinic radiation of two different wavelengths for the two exposures. In the example given, both exposures are to radiation from the same stationary pulse xenon source. The only photopolymerisable materials mentioned are mixtures of polyenes with polythiols. This method is not easy to carry out successfully. When the initial solidification is carried out by irradiation, since, if too little is given, the liquid composition will not solidify and if too much is given it will not be possible to obtain a good image after the second irradiation. Furthermore, the reaction between the polyene and the polythiol, which is initiated on exposure to actinic radiation, continues when such exposure is interrupted. For this reason the specification recommends commencing the second irradiation less than 30 minutes, and preferably less than 10 minutes after the first irradiation, stating that, in many systems, a retention time between treatments of 30 minutes or longer would result in the inability to attain a proper differentiation in the chemical condition in the solidified mass. This time limitation is a further constraint on industrial utilisation of the process.

It is a feature of the process of the present invention that the curable composition contains two different residues through which polymerisation or curing takes place, one of these residues being activated, directly or indirectly, with actinic radiation at a wavelength that is longer than the longest at which the other residue is activated, so that irradiation can selectively solidify one residue whilst having a negligible effect on the other, which remains photocurable. That such treatment gives a solid coating that will form an image when irradiated a second time, even when there is a long period between the two exposures, is not disclosed in the prior art.

Dual radiation processes for the production of images have also been disclosed in U.S. Pat. Nos. 4,413,052 and 4,416,975. In the first of these a liquid composition containing a compound having in the same molecule both a (meth)acryloyl group and an anthryl group is solidified by exposure to actinic radiation and an image is formed by a second exposure through a negative. The second patent describes a similar process, except that the anthryl group is replaced by a 2,3-disubstituted maleimido group. In neither of these patents is there mentioned the possibility of using radiation of different wavelengths for the two exposures. The difference between the effects of the first and second exposures is a function of the exposure times—the second exposure requiring 15 to 100 times the light energy of the first. It follows that if the first exposure is continued beyond the minimum time needed for solidification, there is a risk that some complete cure will take place which would prevent formation of an image. A further drawback of the methods described in these two patents is the need to have a prolonged second exposure, times of up to 20 minutes being exemplified. If a more reactive system were to be used as the second photopolymerisable material, there would be a greater risk of the first exposure causing complete cure and hence production of an image would be difficult or impossible. A comparatively long second exposure is therefore inevitable.

The use of mixtures of photocurable materials has previously been described in U.S. Pat. No. 4,426,431, which claims such compositions as abrasion-resistant coatings. This specification describes compositions comprising 1. a polymerisable epoxy compound, such as a polyglycidyl ether of an aliphatic polyol,
2. a cationic initiator for the polymerisation of 1, such as an aromatic onium salt,
3. a polymerisable acrylic compound, such as pentaerythritol triacrylate,
4. a haloalkylated aromatic ketone as free radical initiator for 3, such as a halomethylated benzophenone, and
5. a polymerisable organofunctional silane, such as an epoxysilane or acrylated silane.

These compositions are applied as a liquid and cured by a single exposure to U.V. radiation. The formation of images using these compositions is not mentioned.

The use of a bifunctional curing system, both functions of which are activated by exposure to radiant energy, is described in U.S. Pat. No. 4,428,807. This specification describes compositions comprising a partially esterified epoxy ester, prepared from a polyepoxide and a terminally unsaturated monocarboxylic acid, together with a bifunctional curing system capable of initiating both free radical and cationic polymerisation when exposed to radiant energy. This curing system is a mixture of a free radical initiator, such as benzoin or acyloin ethers, with an aromatic onium salt such as p-tert.butylphenyl iodonium hexafluorophosphate. These compositions are cured by irradiation from a single radiant source. The compositions are used as coatings having a good adhesion to metals such as aluminum. There is no indication that radiation in two stages from two different sources would be advantageous.

East German Patent No. 158 281, which is summarized in Chemical Abstracts, 99 96846y discloses the formation of images using a composition containing an ethylenically unsaturated compound, an initiator for the radical polymerisation of this compound, a cationically polymerisable material, and a coinitiator for this. An exemplified composition contained glycidyl methacrylate, an acrylic acid-ethyl acrylate-styrene copolymer, benzoin isopropyl ether, and p-methoxy benzenediazonium hexalfluorophosphate. These compositions, which are stated to have improved photosensitivity, a high crosslinking rate, and improved mechanical properties, are cured by a single exposure to radiation.

The formation of images by a process in which solidification is first effected at one wavelength, and then the image is formed by a second exposure at a shorter, (i.e. more energetic) wavelength has not hitherto been described.

This invention therefore provides a process for the production of an image which comprises
(i) applying to a substrate a layer of a liquid composition comprising
  (A) a residue that is polymerisable by means of free radicals,
  (B) a radiation-activated polymerisation initiator for (A)
  (C) a radiation-curable residue that is different from (A) and optionally
  (D) a radiation-activated catalyst for the cure of (C),
(ii) subjecting the composition to actinic radiation having a wavelength at which the initiator (B) is activated but at which the residue (C) and/or the catalyst (D) are not substantially activated, thereby polymerising (A) such that the layer of liquid composition is solidified, but remains curable,
(iii) subjecting the solidified layer in a predetermined pattern to actinic radiation having a wavelength that is shorter than that of the radiation used in stage (ii) and at which the radiation-curable residue (C) and/or the catalyst (D) is activated, such that in the exposed area (C) is substantially cured, and (iv) removing areas of the solidified layer that have not been substantially cured.

The expression "subjecting . . . in a predetermined pattern to actinic radiation" includes both exposure through an image-bearing transparency consisting of opaque and transparent parts, and also subjection to a beam of actinic radiation moved in a predetermined pattern, for example as directed by a computer, so as to form an image.

The curable liquid compositions used in accordance with the present invention may comprise a mixture of one or more substances that are polymerised by exposure to actinic radiation at a certain wavelength, together with one or more substances that are polymerised by exposure to actinic radiation only at a shorter wavelength. Alternatively, it may comprise one or more "dual-function" substances, that is substances having in the same molecule two types of photopolymerisable function, one of which is activated only by irradiation at a wavelength that is shorter than that at which the other may be activated. The compositions may further comprise a mixture of one or more dual functional substances, as described, together with one or more substances that are polymerised by exposure to actinic radiation at the longer or shorter wavelengths at which the dual functional material is polymerised.

In a preferred method, the first irradiation is effected using radiation in the visible spectrum, and the second irradiation is effected using ultraviolet radiation; however both irradiations may be made using ultraviolet radiation, but of different wavelengths.

Residues that are polymerisable by means of free radicals suitable for use as part (A) of the liquid composition, are well known and are preferably esters of ethylenically unsaturated monocarboxylic acids, vinyl group containing compounds, or mixtures of a polyene with the polythiol.

Preferred esters of ethylenically unsaturated monocarboxylic acids have at least one group of formula $$CH_2=C(R^1)COO— \qquad I$$

where
$R^1$ is a hydrogen, chlorine, or bromine atom or an alkyl group of 1 to 4 carbon atoms, especially a hydrogen atom or a methyl group. Suitable such esters are acrylates and 2-substituted acrylates of monohydric alcohols such as 2-methoxyethanol, 2-cyanoethanol, furfuryl alcohol, glycidol, and cyclohexanol, and full or partial esters of polyhydric alcohols such as butane diol, pentaerythritol, dipentaerythritol, tri- and tetraethylene glycols, trimethylolpropane and glycerol. Also suitable are esters formed by reaction of an alkylene oxide, particularly ethylene oxide or propylene oxide, with an acrylic acid, typically 2-hydroxyethyl and 2-hydroxypropyl acrylates and methacrylates. There may also be used esters formed by reaction of a compound containing one or more glycidyl groups, especially a mono- or polyglycidyl ether of a mono- or polyhydic alcohol or phenol or a N-glycidylhydantoin, with acrylic or meth-acrylic acid. Other suitable compounds are esters formed by reaction of a diepoxide with an adduct of a hydroxyalkyl acrylate or 2-substituted acrylate with a saturated or unsaturated discarboxylic acid anhydride such as succinic, maleic, or phthalic anhydride.

Typical such compounds include 1,4bis(2-hydroxy-3-acryloyloxypropoxy)butane, a poly(2-hydroxy-3-acryloyloxypropyl) ether of a bisphenol or a phenol-formaldehyde novolak, 2,2-bis(4-(2-hydroxy-3-(2-acryloyloxyethoxy)succinyloxypropoxy)phenyl)propane, 1-(2-hydroxy-3-acryloyloxypropoxy)-butane, -octane, and -decane, bis(2-hydroxy-3-acryloyloxypropyl) adipate, 2-hydroxy-3-acryloyloxypropyl propionate, 3-phenoxy-2-hydroxypropyl acrylate, 2-hydroxyethyl acrylate, 2-hydroxypropyl acrylate, trimethylolpropane trisacrylate, pentaerythritol tetracrylate, and the corresponding methacrylates.

There is a wide range of vinyl group-containing compounds that may be used as part (A) of the liquid composition including vinyl-substituted aromatic compounds such as styrene, alpha methyl styrene, and vinyl toluene, vinyl esters such as vinyl acetate, allyl compounds such as diallyl maleate and dimethallyl fumarate, and vinyl heterocyclic such as 2-, 3-, or 4-vinyl pyridine and 2- or 3-vinyl pyrrolidine.

Polyenes that, mixed with polythiols, may be used as part (A), have at least two groups of the formula

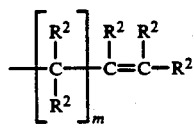

or

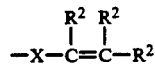

where
the groups $R^2$, which may be the same or different, are selected from hydrogen, fluorine and chlorine atoms and furyl, thienyl, pyridyl, phenyl, substituted phenyl, benzyl and substituted benzyl, alkyl, substituted alkyl, alkoxy and substituted alkoxy of from 1 to 9 carbon atoms and cycloalkyl and substituted cycloakyl groups of from 3 to 8 carbon atoms, the substituents being selected from chlorine and fluorine atoms and acetoxy, nitro, acetamido, phenyl, benzyl, alkyl, alkoxy and cycloalkyl groups, m is an integer of from 1 to 9, and X represents a group $-NR^2-$, $-O-$, or $-S-$.

Polythiols that, mixed with these polyenes, may also be used as part (A) have the general formula

where
$R^3$ is a polyvalent organic group free from reactive carbon-to-carbon unsaturation and n is at least 2.

Preferably the organic group $R^3$ is an aliphatic chain of 2 to 10 carbon atoms, an arylene group of 6 to 10 carbon atoms, an alkarylene group of 7 to 16 carbon atoms, a cycloakylene group of 5 to 10 carbon atoms, or a cycloalkyl alkylene group of 6 to 16 carbon atoms, any of which may be substituted and may contain oxygen atoms or ester groups in the alkylene chains. Specific examples of preferred polythiols include ethylene glycol bis(thioglycolate), ethylene glycol bis(beta-mercaptopropionate), trimethylol propane tris(thioglycolate), trimethylolpropane tris(beta mercaptopropionate), pentaerythritol tetrakis (thioglycolate), pentaerythritol tetrakis(beta-mercaptopropionate), and thioglycolates, beta-mercaptopropionates and 3-mercapto-2-hydroxypropyl ethers of polyoxyalkylene glycols and triols such as polypropylene ether glycol bis(beta-mercaptopropionate) and a 3-mercapto-2-hydroxypropyl ether of a polyoxypropylene triol derived from glycerol.

The molar ratio of ene:thiol groups must be selected so as to give a solid product on exposure to radiation, ratios within the range 1:0.5–2 being preferred.

As mentioned above, photocurable polyene-polythiol mixtures continue to cure even when the source of actinic radiation is removed, so that the use of such mixtures in compositions that are solidified and an image formed by two exposures to actinic radiation of the same wavelength requires very careful control and a minimum of delay between the two exposures. In the present process however, the initial exposure may be allowed to cure completely the polyene-polythiol component of the mixture, so that long term storage can have very little effect on it. The radiation curable residue present in the composition that is unaffected by radiation of the wavelength used to cure the polyene polythiol mixture is also unaffected by long term storage. When the imagewise exposure is carried out at a wavelength that does affect this second radiation curable residue, a developable image is formed.

The polymerisation initiator (B) that forms free radicals that polymerise the residue (A) when exposed to actinic radiation, may be sensitive to visible light or to ultraviolet radiation. Such initiators are known and include benzoin ethers, acyloin ethers, halogenated alkyl or aryl derivatives, aromatic carbonyl derivatives, metallocenes, mixtures of Group IVA organometallic compounds with photoreducible dyes, mixtures of quinones with aliphatic amines having hydrogen attached to an aliphatic alpha carbon atom, aliphatic dicarbonyl compounds, optionally mixed with an amine, 3-ketocoumarins, acyl phosphine oxides, metal carbonyls, and mixtures of photoreducible dyes with reducing agents. Preferred polymerisation initiators (B) are camphorquinone with a tertiary amine having a hydrogen atom attached to an aliphatic alpha carbon atom, such as bis(4-dimethylamino)benzophenone and triethanolamine, biacetyl, dimanganese decacarbonyl, benzil dimethyl ketal, isobutyl benzoin ether, 2,2,2-trichloro-4'-tert.butylacetophenone, diethoxyacetophenone, coumarins having a carbocylic or heterocyclic aromatic ketone group in the 3-position, such as 3-benzoyl-7-methoxy coumarin or 3-(4-cyanobenzoyl)-5,7-dipropoxy coumarin, mixtures of photoreducible dyes, typically methylene blue or rose bengal, with a stannane such as trimethyl benzyl stannane, tributyl benzyl stannane, tributyl 4-methylbenzyl stannane or dibutyl dibenzyl stannane, mixtures or photoreducible dyes with an electron donor such as sodium benzenesulphinate or benzenesulphinic acid, and a titanium metallocene such as bis(pimethylcyclopentadienyl)bis(sigma pentafluorophenyl)titanium (IV) or bis(pimethylcyclopentadienyl)-bis(sigma hexyloxytetrafluorophenyl) titanium (IV).

Compositions as described in which the initiator (B) is a metallocene or a mixture of a Group IVA organometallic compound with a photoreducible dye are themselves new. This invention therefore provides new compositions, suitable for use in the process described comprising (A) a residue that is polymerisable by means of free radicals,
(B) a radiation-activated polymerisation initiator for (A) that is a metallocene or a mixture of a Group IVA organometallic compound with a photoreducible, dye,
(C) a radiation-curable residue that is different from (A), and optionally
(D) a radiation-activated catalyst for the cure of (C).

Preferred metallocenes that are used in the new compositions are the titanocenes of formula

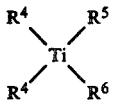   V where
each group $R^4$ is independently selected from an optionally substituted cyclopentadienyl or indenyl group or together they form an alkylidene group of 2 to 12 carbon atoms, a cycloalkylidene group having from 5 to 7 carbon atoms in the ring, a group $Si(R^7)_2$ or $Sn(R^7)_2$, or an optionally substituted group of formula

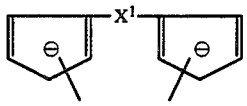

$X^1$ denotes a methylene, ethylene, or 1,3-propylene group,
$R^5$ denotes a 6-membered carbocyclic or 5- or 6-membered heterocyclic aromatic ring, substituted by a fluorine atom in at least one of the two positions ortho to the metal-carbon bond, the ring optionally being further substituted, or
$R^5$ with $R^6$ denotes a group —Q—Y—Q—,
Q denotes a 5- or 6-membered carbocyclic or heterocyclic aromatic ring, in which each of the two bonds is ortho to the Q—Y bond, and each position meta to the Q—Y bond is substituted by fluorine, the groups Q optionally being further substituted,
Y denotes a methylene group, an alkylidene group having from 2 to 12 carbon atoms, a cycloalkylidene group having from 5 to 7 carbon atoms in the ring, a direct bond, a group $NR^7$, an oxygen or sulphur atom, or a group —SO$_2$—, —CO—, $Si(R^7)_2$— or —Sn(R$^7$)$_2$—,
$R^6$ denotes an alkynyl or phenylalkynyl group that may be substituted, an azido or cyano group, or a group of formula $Si(R^7)_2$ or $Sn(R^7)_2$, or it has the same meaning as the group $R^5$, and
$R^7$ denotes an alkyl group of from 1 to 12 carbon atoms, a cycloalkyl group of from 5 to 12 carbon atoms, an aryl group of from 6 to 16 carbon atoms, or an aralkyl group of from 7 to 16 carbon atoms.

The $R^4$ groups are preferably identical. Suitable substituents for $R^4$ are: linear or branched alkyl, alkoxy and alkenyl of preferably up to 18, especially up to 12 and most preferably up to 6, carbon atoms, e.g. methyl, ethyl, propyl, isopropyl, n-butyl, tert-butyl, pentyl, hexyl, octyl, decyl, dodecyl, tetradecyl, hexadecyl, octadecyl and corresponding alkenyl and alkoxy groups; cycloalkyl and cycloalkenyl containing preferably 5 to 8 ring carbon atoms, e.g. cyclopentyl, cyclohexyl, cycloheptyl, methylcyclopentyl and methylcyclohexyl; aryl of preferably 6 to 16 carbon atoms and aralkyl of preferably 7 to 16 carbon atoms, e.g. phenyl, naphthyl, biphenyl, benzyl and phenylethyl; nitrilo, halogen, preferably F, Cl and Br, and also amino, preferably tertiary amino which may contain linear or branched alkyl groups of 1 to 12, preferably 1 to 6, carbon atoms, in particular methyl or ethyl, or phenyl and benzyl, which amino groups can also be quaternised, in particular with linear or branched alkyl halides containing preferably 1 to 12 carbon atoms, preferably methyl or ethyl halides; linear or branched aminoalkyl, preferably tertiary aminoalkyl which may also be quaternised, in particular with alkyl halides, and the alkylene group in the aminoalkyl can be linear or branched and contains preferably 1 to 12, most preferably 1 to 6, carbon atoms, and is most preferably α-branched $C_1$-$C_{12}$alkyl.

The radicals $R^4$ may contain 1 to 3 substituents, but preferably contain one substituent. It is preferred that both substituents $R^4$ are cyclopentadienyl⊖ or methylcyclopentadienyl⊖.

Alkylidene groups $X^1$ and Y preferably contain 2 to 6 carbon atoms. Exemplary of alkylidene groups and cycloalkylidene groups $X^1$ and Y are ethylidene, 2,2-propylidene, butylidene, hexylidene, phenylmethylene, diphenyl-methylene, cyclopentylidene and cyclohexylidene. $X^1$ is most preferably methylene. $R^7$ as alkyl preferably contains 1 to 6 carbon atoms and is e.g. methyl, ethyl, propyl, butyl or hexyl; $R^7$ as cycloalkyl is preferably cyclopentyl or cyclohexyl; and as aryl is preferably phenyl; and as aralkyl is preferably benzyl.

$R^5$ is preferably substituted in both ortho-positions by fluorine.

$R^5$ as carbocyclic aromatic and fluorine-substituted ring may be indene, indane, fluorene, naphthalene and preferably phenyl. Examples are: 4,6-difluoroinden-5-yl, 5,7-difluoronaphth-6-yl, 2,4-difluorofluoren-3-yl, 1,3-difluoronaphth-2-yl and, preferably, 2,6-difluorophen-1-yl.

$R^5$ as heterocyclic aromatic 5-membered ring preferably contains one hetero-atom and, as 6-membered ring, contains preferably 1 or 2 hetero-atoms. Examples of such rings substituted by two fluorine atoms are: 2,4-difluoropyrrol-3-yl, 2,4-difluorofur-3-yl, 2,4-difluorothiophen-3-yl, 2,4-difluoropyrid-3-yl, 3,5-difluoropyrid-4-yl and 4,6-difluoropyrimid-5-yl.

$R^5$ and $R^6$ together as a group of formula —Q—Y—Q— may be e.g.:

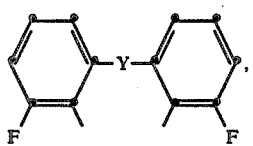

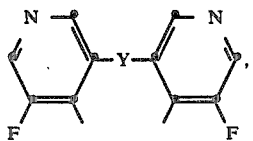

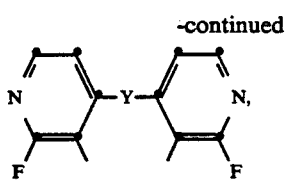

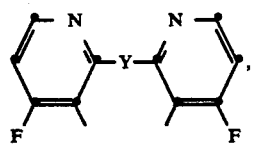

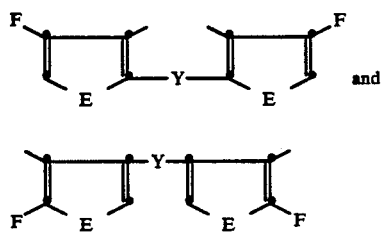 and

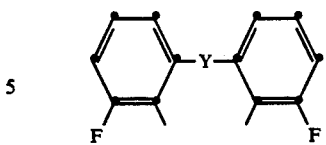

wherein Y has the above meaning and is in particular a direct bond, —CH$_2$— or —O—.

A preferred group of metallocenes of the formula V comprises those compounds wherein each R$^4$ is π-cyclopentadienyl or π-cyclopentadienyl which is substituted by C$_1$-C$_4$alkyl, preferably methyl, and each of R$^5$ and R$^6$ is a radical of the formula

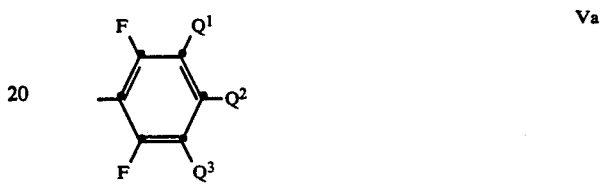

wherein E is O, S or NH. Y is preferably methylene, ethylidene, 2,2-propylidene, a direct bond, or O.

The radicals R$^5$ and the groups Q in groups —Q—Y—Q— can be partly or completely substituted by further groups. Suitable groups are: linear or branched alkyl or alkoxy, each preferably of 1 to 18, most preferably 1 to 6, carbon atoms, e.g. methyl, ethyl, propyl, butyl, pentyl, hexyl, and the corresponding alkoxy groups, with methyl, methoxy and hexyloxy being preferred; cycloalkyl containing preferably 5 or 6 ring carbon atoms, aryl of preferably 6 to 16 carbon atoms and aralkyl of preferably 7 to 16 carbon atoms, e.g. cyclopentyl, cyclohexyl, phenyl or benzyl; hydroxyl, carboxyl, CN, halogen such as F, Cl or Br, and amino, preferably tertiary amino which may be quaternised with an alkyl halide such as methyl chloride, methyl bromide or methyl iodide, examples of amino groups being methylamino, ethylamino, dimethylamino, diethylamino, pyrrolidyl, piperidyl, piperazyl, morpholyl, N-methylpiperazyl; alkoxycarbonyl containing preferably 1 to 18, most preferably 1 to 6, carbon atoms in the alkoxy moiety, aminocarbonyl containing one or two C$_1$-C$_{12}$ alkyl groups in the amino group, or aminocarbonyl containing heterocyclic amines such as pyrrolidine, piperidine, piperazine, N-methylpiperazine, and morpholine; aminoalkyl, especially tertiary aminoalkyl which preferably contains C$_1$-C$_6$alkyl groups and which may be quaternised with an alkyl halide, most preferably tertiary aminoalkyl which may be substituted by C$_1$-C$_6$alkyl, e.g. dimethylaminomethyl and trimethylammoniummethyl iodide.

R$^6$ as alkynyl is e.g. 2-butynyl and, preferably, propargyl.

Examples of substituents for R$^6$ as phenylalkynyl are halogen such as F, Cl, Br, C$_1$-C$_6$alkyl and C$_1$-C$_6$alkoxy, carboxyl, OH and CN, R$^6$ preferably has the meaning of R$^5$.

In a preferred embodiment of the invention, R$^5$ and R$^6$ in formula V are unsubstituted or substituted 2,6-difluorophen-1-yl or R$^5$ and R$^6$ together form a radical of the formula wherein each of Q$^1$, Q$^2$ and Q$^3$ independently is a hydrogen atom, F, Cl, Br, a tertiary amino group, preferably morpholino group, or an alkoxy group, preferably a methoxy or hexyloxy group. The amino or alkoxy group is preferably attached in the para-position to the free bond. A preferred subgroup comprises those metallocenes of the formula V, wherein each R$^4$ is π-methylcyclpentadienyl or π-cyclopentadienyl, and each of R$^5$ and R$^6$ is a radical of the formula Va, wherein Q$^1$ and Q$^3$ are H, F, Cl or Br and Q$^2$ is H, F or alkoxy. Preferably, each of Q$^1$ and Q$^3$ independently is a hydrogen or fluorine atom, and Q$^2$ is fluorine, or hexyloxy.

Compounds of formula V, and their preparation, are described in Australian Patent Specification No. 8424454.

Preferred Group IVA organometallic compounds used in the new compositions are organostannanes of formula VI

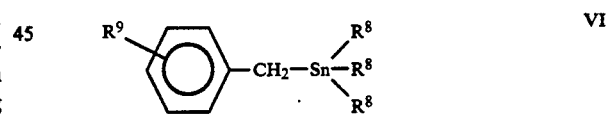

where

R$^8$ denotes an alkyl group of from 1 to 4 carbon atoms, or an alkenyl or alkynyl group of from 2 to 4 carbon atoms, and R$^9$ denotes a hydrogen or halogen atom or an alkyl or alkoxy group of from 1 to 4 carbon atoms.

Preferred compounds of formula VI are those where R$^8$ denotes an alkyl group of 1 to 4 carbon atoms and R$^9$ denotes a hydrogen atom or an alkyl group of 1 to 4 carbon atoms.

These organostannanes are prepared by Grignard coupling of a benzyl magnesium halide with a trialkyltin halide in an inert solvent, followed by filtration, aqueous washing and distillation of the product.

Preferred photoreducible dyes that are used with these organostannanes are methylene blue and rose bengal.

The radiation curable residue (C) may be one in which polymerisation is effected by direct activation of photosensitive groups through radiation, or those in which the radiation activates a suitable catalyst (D) which then activates polymerisable groups.

Materials having photosensitive groups are well known and include those having at least two, and preferably three or more, groups which are azido, coumarin, stilbene, maleimido, pyridinone, chalcone, propenone, pentadienone, anthracene, or acrylic ester groups which are substituted in their 3-position by a group having ethylenic unsaturation or aromaticity in conjugation with the ethylenic double bond of the acrylic group.

Materials in which photopolymerisation is effected by activation of photoinitiator which then activates polymerisable groups include epoxide resins, phenolic resins, cyclic ethers, vinyl ethers, cyclic esters, cyclic sulphides, cyclic amines and organosilicon cyclics in combination with, as D, a radiation-sensitive aromatic 'onium salt, such as diazonium, sulphonium, iodonium, and sulphoxonium salts, or a radiation-sensitive aromatic iodosyl salt.

Examples of suitable azides are those containing at least two groups of formula $$N_3Ar-  \quad\quad VII$$

where Ar denotes a mononuclear or nuclear divalent aromatic radical containing in all from 6 to at most 14 carbon atoms, especially a phenylene or naphthylene group.

Examples of suitable coumarins are those containing groups of the formula

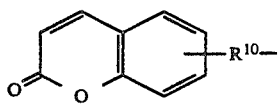

VIII wherein $R^{10}$ is an oxygen atom, a carbonyloxy group (—COO—), a sulphonyl group, or a sulphonyloxy group.

Examples of those containing stilbene groups are those containing groups of the formula

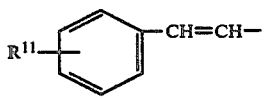

IX where $R^{11}$ is the residue, containing up to 8 carbon atoms in all, of a five or six-membered nitrogen-containing heterocyclic ring, fused to a benzene or naphthalene nucleus, and linked through a carbon atom of the said heterocyclic ring adjacent to a nitrogen hetero atom thereof to the indicated benzene nucleus, such as a benzimidazolyl, benzoxazolyl, benzotriazolyl, benzothiazolyl, or a naphthotriazolyl residue.

Examples of those containing maleimide units are those having groups of the formula

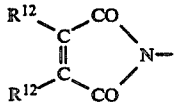

X where each $R^{12}$ is an alkyl group of 1 to 4 carbon atoms, a chlorine atom, or a phenyl group, and especially a methyl group.

Examples of those containing pyridinone units are those having groups of the formula

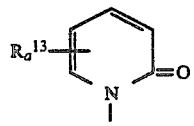

XI where
$R^{13}$ is an aliphatic or cycloaliphatic radical of 1 to 8 carbon atoms and
a is zero or an integer of 1 to 4.

Examples of compounds containing chalcone, propenone, and pentadienone groups are those containing groups of formula

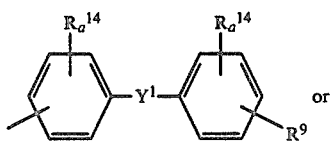

XII or

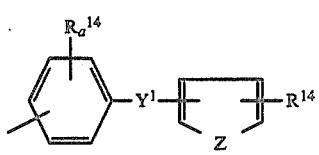

XIII where
each $R^{14}$ is a halogen atom, or an alkyl, cycloalkyl, alkenyl, cycloalkenyl, alkoxy, cycloalkoxy, alkenoxy, cycloalkenoxy, carbalkoxy, carbocycloalkoxy, carbalkenoxy, or carbocycloalkenoxy group, such organic groups containing 1 to 9 carbon atoms, or is a nitro group, or a carboxyl, sulfonic, or phosphoric acid group in the form of a salt,
a has the meaning previously assigned,
$R^{15}$ represents a valency bond or a hydrogen atom,
$Y^1$ represents a grouping of formula

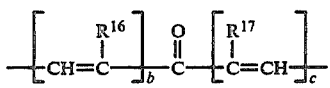

XIV

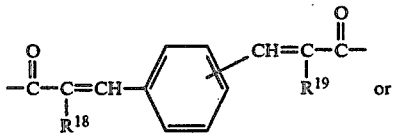

XV or

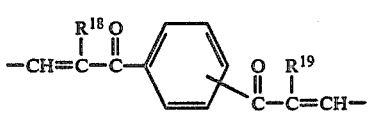

XVI $R^{16}$ and $R^{17}$ are each individually a hydrogen atom, an alkyl group, e.g., of 1 to 4 carbon atoms, or an aryl group, preferably a mononuclear group such as a phenyl group, or $R^{16}$ and $R^{17}$ conjointly denote a polymethylene chain of 2 to 4 methylene groups, $R^{18}$ and $R^{19}$ are each a hydrogen atom, an alkyl group, e.g., of 1 to 4 carbon atoms, or an aryl group which is preferably a mononuclear group such as a phenyl group, b and c are each zero, 1, or 2, with the proviso that they are not both zero, and Z is an oxygen or sulphur atom Suitable anthracenes are those containing anthryl groups, such as 1-, 2-, or 9-anthryl groups, which are unsubstituted or have one or two bromo, chloro, methyl, or nitro substituents.

Suitable 3-substituted acrylates contain groups of the general formula

$$R^{20}CH=C(R^{21})COO- \qquad XVII$$

where $R^{20}$ is an aliphatic or mononuclear aromatic, araliphatic, or heterocyclic group which, as already indicated, has ethylenic unsaturation or aromaticity in conjugation with the ethylenic double bond shown, such a phenyl, 2-furyl, 2- or 3-pyridyl, prop-2-enyl, or styryl group, and $R^{21}$ is a hydrogen or chlorine atom or a methyl or ethyl group.

Typical epoxide resins that may be used as component (C) are polyglycidyl esters obtainable by reaction of a compound containing two or more carboxylic acid groups per molecule with epichlorohydrin or glycerol dichlorohydrin in the presence of an alkali. Such glycidyl esters are preferably derived from aliphatic di and polycarboxylic acids, e.g., succinic acid, glutaric acid, adipic acid, pimelic acid, suberic acid, azelaic acid, sebacic acid, or dimerised or trimerised linoleic acid; from cycloaliphatic di and polycarboxylic acids such as 1,2-cyclohexane dicarboxylic acid, and from aromatic di and polycarboxylic acids such as phthalic acid, isophthalic acid, and terephthalic acid.

Further examples are di and polyglycidyl ethers obtainable by reaction of a compound containing two or more free alcoholic hydroxyl and/or phenolic hydroxyl groups per molecule with epichlorohydrin under alkaline conditions or, alternatively, in the presence of an acidic catalyst and subsequent treatment with alkali. These ethers may be made from acyclic alcohols such as ethylene glycol, poly(oxyethylene)glycols, propane-1,2-diol, poly(oxypropylene) glycols, propane-1,3-diol, butane-1,4-diol, poly(oxytetramethylene) glycols, glycerol, pentaerythritol, and poly(epichlorohydrin). Or they may be made from mono and polynuclear phenols, such as resorcinol, bis(4-hydroxyphenyl) methane, 4,4'-dihydroxydiphenyl, bis(4-hydroxyphenyl) sulphone, 1,1,2,2-tetrakis(4-hydroxyphenyl)ethane, 2,2-bis(4-hydroxyphenyl)-propane (otherwise known as bisphenol A), 2,2-bis(3,5-dibromo-4-hydroxyphenyl)propane, and novolaks formed from aldehydes such as formaldehyde with a phenol.

Other suitable components (C) are poly(N-glycidyl) compounds including, for example, those obtained by dehydrochlorination of the reaction products of epichlorohydrin with amines containing at least two amino-hydrogen atoms, such as aniline, n-butylamine, and bis(4-aminophenyl)methane; triglycidyl isocyanurate; and N,N'-diglycidyl derivatives of cyclic alkylene ureas, such as ethyleneurea, and of hydantoins such as 5,5-dimethylhydantoin.

Epoxide resins in which some or all of the epoxide groups are not terminal may also be employed, such as vinylcyclohexene dioxide, limonene dioxide, dicyclopentadiene dioxide, 4-oxatetracyclo[6.2.1.0$^{2,7}$.0$^{3,5}$]undec-9-yl glycidyl ether, the bis(4-oxatetracyclo[6.2.1.0$^{2,7}$.0$^{3,5}$]undec-9-yl) ether of ethylene glycol, 3,4-epoxycyclohexylmethyl 3',4'-epoxycyclohexanecarboxylate and its 6,6'-dimethyl derivative, the bis(3,4-epoxycyclohexanecarboxylate) of ethylene glycol, 3-(3,4-epoxycyclohexyl)-8,9-epoxy-2,4-dioxaspiro[5,5]undecane, and epoxidised butadienes or copolymers of butadiene with ethylenic compounds such as styrene and vinyl acetate. If desired a mixture of compounds (C) may be used.

Especially preferred epoxide resins used as component (C) in the process of this invention are diglycidyl ethers of dihydric phenols such as 2,2-bis(4-hydroxyphenyl)propane and bis(4-hydroxyphenyl)methane and of dihydric alcohols such as of butane-1,4-diol, polyglycidyl ethers of novolaks, especially cresol-formaldehyde novolaks and cycloaliphatic epoxide resins such as 3,4-epoxycyclohexylmethyl-3',4'-epoxycyclohexanecarboxylate and 1,4-bis(3,4-epoxycyclohexylmethyl)butanedicarboxylate.

Onium salts which, when combined with an epoxide resin or other cationically-polymerisable substances, give photopolymerisable mixtures, are described in U.S. Pat. Nos. 4,058,400 and 4,058,401. Suitable sulphoxonium salts that may be used for the same purpose are disclosed in U.S. Pat. Nos. 4,299,938 4,339,567 and 4,383,025. Iodonium salts that may also be used for this purpose are described in British Patent Specification No. 1 516 352. Isodosyl salts that may be used are described in European Patent Specification No. 0 104 143.

If desired the free radical polymerisable residue (A) and the radiation curable residue (C) may form part of the same molecule, i.e. a dual-functional material. Preferred dual functional materials are those containing an ester of an ethylenically unsaturated monocarboxylic acid, particularly an ester group of formula I, with an epoxide group, a compound containing both an ethylenically unsaturated carboxylic ester group and an anthryl group or a substance containing both an epoxide group and an allyl or methallyl group.

The first type of dual functional material may be prepared by reaction of an unsaturated monocarboxylic acid with a stoichiometric deficit of a di- or polyepoxide. The second type of dual functional material may be prepared by reaction of a compound containing both a 1,2-epoxide group and an unsaturated ester group with an anthryl compound containing a group capable of reaction with the 1,2-epoxide group, such as a carboxylic acid, phenolic, or alcoholic hydroxyl or imido group. The third type of dual functional material may be an allylic epoxide resin produced, for example, by glycidylation of an allyl-substituted bisphenol. The reaction of epoxide with unsaturated acids follows well known procedures. Reaction of an epoxide with a suitable anthryl compound is described in U.S. Pat. No. 4,413,052.

The weight ratio of free radical polymerisable material (A) to radiation curable residue (C) is not critical, as long as effective amounts of both components are used. Where (A) and (C) are on separate molecules, the weight ratio (A):(C) is generally within the range 1:0.1-10, especially 1:1-5. The amount of polymerisation initiator (B) that is used is also not critical, as long as there is enough to initiate polymerisation of (A) during the first exposure to actinic radiation. Typical amounts of (B) are within the range 0.1-50 parts by weight of (B) per 100 parts of (A), especially 0.2 to 10 parts.

Suitable sources of actinic radiation include carbon arcs, mercury vapor arcs, fluorescent lamps with phosphors emitting ultraviolet light, argon and xenon glow lamps, tungsten lamps, and photographic flood lamps. It is important that the first irradiation is effected using radiation of a longer wavelength than that used in the second irradiation. The use of filters, to screen out irradiation of short wavelengths, may be found to be advantageous since, in this way, a single, wide spectrum source of irradiation may be used. If such a single source of radiation is used, the first exposure is effected with a filter preventing short wavelength irradiation from reaching the composition, so that only residue (A) is polymerised. In the second exposure, the whole unfiltered spectrum of radiation may be used, so that the short wavelength irradiation effects cure of residue (C).

The compositions as described may be applied as a liquid to a substrate such as steel, aluminium, copper, paper, silicon or plastics. After the coating has been applied, the first exposure takes place, resulting in solidification of the composition. The coated substrate is then stable and may be stored for prolonged periods away from short wavelength actinic irradiation. When desired, the coated substrate is given an imagewise exposure to actinic radiation of a shorter wavelength than that used in the first exposure. Those parts of the coating that have not received the second exposure may then be removed, usually by washing in a suitable solvent such as cyclohexanone, 2-ethoxyethanol, diethylene glycol monobutyl ether, gamma butyrolactone, toluene, acetone, propylene carbonate, 1,1,1-trichloroethane and mixtures thereof, and aqueous solvents such as dilute aqueous sodium carbonate or sodium hydroxide. The coated substrate may be heated after the imagewise exposure and before development to increase resistance to developer in exposed areas of the coating. Dry development, such as plasma etching, may also be used. Thus the process of this invention may be used in the production of printing plates and printed circuits, using well known techniques.

The following examples illustrate the invention. All parts are by weight. The resins used in these examples are as follows:

Resin 1

This denotes an expoxidised o-cresol novolak having a softening point of 99° C. and an epoxide content of 4.2 equivalents/kg.

Resin 2

This denotes 2-hydroxyethyl methacrylate.

Resin 3

This denotes 1,4-bis(3,4-expoxycyclohexymethyl)butane dicarboxylate, having an epoxide content of 4.8 equivalents/kg.

Resin 4

This denotes trimethylolpropane trismethacrylate.

Resin 5

This is prepared by the following method: bisphenol A diglycidyl ether (250 g) is heated to 120° C. and a mixture of acrylic acid (94.9 g), chromium III tris octanoate (0.16 g; 5% solution in ligroin), and 2,6-di-tert.butyl-4-methyl phenol (0.5 ) is added dropwise with stirring. Heating is continued for 5 hours, by which time the epoxide content of the mixture is negligible. The product, Resin 5, is 2,2-bis(4-(3-acryloyloxy-2-hydroxypropoxy)phenyl)propane.

Resin 6

This is prepared by the following method: anthracene-9-carboxylic acid (4 g) is added to a mixture at 100° C. of glycidyl methacrylate (2.8 g), tetramethylammonium chloride (0.1 g), and 2,6-di-tert.butyl-4-methylphenol (0.1 g). This mixture is stirred at 100° C. for 4 hours, by which time the epoxide content is negligible, to given Resin 6, which is 2-hydroxy-3-methacryloyloxypropyl anthracene-9-carboxylate.

Resin 7

This denotes 3,4-epoxycylohexylmethyl-3', 4'-epoxycyclohexane carboxylate.

Resin 8

This is prepared according to the procedure described in J. Polym. Sci. Polym. Chem. (1983) 21 1785.

A mixture of bisphenol A (45.6 g, 0.2 mole), powdered sodium hydroxide (24 g, 0.6 mole) and dimethyl sulphoxide (DMSO) (75 ml) is heated at 70° C. for an hour under a nitrogen blanket. 2-Chloroethylvinyl ether (64 g, 0.6 mole) is added dropwise over 30 minutes, keeping the temperatures below 80° C. When the addition is complete, a further 25 ml DMSO is added and the reaction mixture is stirred for a further 5 hours at 70° C. This is cooled and poured into water (100 ml). An oily layer separates which is dissolved in diethyl ether (60 ml). The ethereal layer is washed with water ($3\times 50$ ml), dried (anhydrous magnesium sulphate), and concentrated to dryness on a rotary evaporator. The pale yellow oil is recrystallised from 95% ethanol to give 59.8 g of Resin 8, 2,2-bis(4-vinyloxethoxyphenyl)-propane, IR (KBr disc) 3070, 3050, 2980, 2950, 2939, 2880, 1620, 1511, 1453, 1322, 1251, 1209, 1075, 982, 841, 821 $cm^{-1}$; NMR (Acetone-$d_6$) 1.65 (s, 6H), 3.8–4.5 (m,12H), 6.5–7.5 (m, 10H)$\delta$.

Resin 9

This denotes trimethylolpropane trisacrylate.

Resin 10

This denotes the tri(3-mercapto-2-hydroxpropyl) ether of a polyoxypropylene triol derived from glycerol and having an average molecular weight of 800.

Resin 11

This denotes a diglycidyl ether of 2,2-bis(3-allyl-4-hydroxyphenyl)propane, having an epoxide content of 4.5 equivalents/kg. Dimethyltricyclo($3.3.1.1.^{3,7}$)decane-1carbonylmethyl-sulfoxonium hexafluorophosphate used in Examples 11 and 14 is prepared as described in EP-A-0 164 314.

EXAMPLE 1

A mixture of Resin 1 (27.5 parts), Resin 2 (11 parts), and Resin 3 (10 parts) is added to a mixture of Rose bengal (0.05 part), tri n-butyl benzyl stannane (5 parts), and triphenylsulphonium hexafluorophosphate (5 parts), and stirred until homogeneity is obtained.

The mixture is coated onto a copper clad laminate to a thickness of 15 micrometers. The coated laminate is then irradiated using a 500 w tungsten-halogen lamp producing radiation with a wavelength over 400 nm at a distance of 200 mm for 3 minutes, by which time the coating is solid and non-tacky. The solidified coating is then irradiated through a transparency using a 500 w metal halide lamp producing radiation within a wavelength of 340–450 nm, at a distance of 750 mm for 3 minutes. Development in gamma butyrolactone produces a negative image of the transparency.

EXAMPLE 2

A mixture of Resin 1 (27.5 parts), Resin 2 (11 parts), Resin 3 (10 parts) and Resin 4 (1.4 parts) is added to a mixture of methylene blue (0.05 part), tri n-butyl benyl stannane (5 parts) and triphenylsulponium hexafluorophosphate (5 parts), and mixed to obtain a homogeneous solution. The mixture is coated onto a copper clad laminate to a thickness of 15 micrometers and the coating is solidified by irradiation using a 500 w tungsten halogen lamp at a distance of 200 mm for 3½ minutes. The solidified coating is then irradiated through a transparency using a 500 w metal halide lamp at a distance of 750 mm for 3 minutes. Development in gamma butyrolactone gives a negative image of the transparency.

EXAMPLE 3

Resin 1 (6.5 parts), Resin 2 (3.5 parts), Resin 3 (1 part) and Resin 5 (1 part) are mixed, and the mixture combined with Rose bengal (0.02 part), di n-butyl diphenyl stannane (0.3 part) and triphenylsulphonium hexafluorophosphate (0.3 part). The mixture is coated onto a copper clad laminate to a thickness of 6–8 micrometers, and solidified by exposure to a 400 w metal halide lamp, with an output at 420 nm, at a distance of 400 mm for 4 mins. The solidified coating is then irradiated through a transparency using a 125 w metal halide lamp with an output at 313 nm, at a distance of 750 mm for 3 minutes. Development in gamma butyrolactone gives a negative image of the transparency.

EXAMPLE 4

Resin 1 (65 parts) and Resin 2 (35 parts) are mixed with triphenyl sulphonium hexafluorophosphate (5 parts) and bis(pi-methylcyclopentadienyl) bis(sigma pentafluorophenyl)-titanium (IV) (1 part) in acetone (1 part). The mixture is coated onto a copper clad laminate to a thickness of 30 micrometers, and irradiated for 1 minute under nitrogen, using the 500 w tungsten halogen lamp described in Example 1, at a distance of 200 mm.

The solidified, non-tacky coating is then irradiated through a transparency using the 5000 w metal halide lamp described in Example 1. Irradiation is at a distance of 750 mm and continues for 4 minutes. Development in a 3:1 mixture of gamma butyrolactone and butyl digol (the monobutyl ether of diethylene glycol), produces a sharp, glossy negative image of the transparency. The laminate can be etched using an aqueous solution of ferric chloride (40% $FeCl_3$) at 30° C. for 3½ minutes, leaving the coated image intact.

EXAMPLE 5

Example 4 is repeated, replacing the triphenylsulphonium hexafluorophosphate by an equal weight of diphenyliodonium hexafluorophosphate. Imagewise exposure is continued for 5 minutes, producing a clear, negative image of the transparency.

EXAMPLE 6

Resin 6 (85 parts), Resin 2 (15 parts) and bis(pi-methylcyclopentadienyl)-bis(sigma pentafluorophenyl) titanium (IV) (1 part) are mixed and coated onto a copper clad laminate to a thickness of 15 micrometers. The coating is irradiated under nitrogen using the 500 w tungsten halogen lamp described in Example 1 at a distance of 200 mm for 5 minutes. The coating becomes solid and tack-free.

The solidified coating is then irradiated through a transparency using a 80 w per cm medium pressure mercury lamp that produces radiation with a wavelength in the region of 200–400 nm at a distance of 250 mm for 1½ minutes. Development in toluene produces a negative image of the transparency.

EXAMPLE 7

Example 4 is repeated, but to show that over-exposure in the first irradiation is not deleterious, this first exposure is carried out for 1 minute, to give a solid, non-tacky coating, and the irradiation is continued for a further 5 minutes. The second irradiation is then carried out as described in Example 4. Development in a 3:1 mixture of gamma butyrolactone and butyl digol gives an image that is of the same quality as that obtained in Example 4.

EXAMPLE 8

The mixture used in Example 4 is coated onto a copper-clad laminate to a thickness of 30 micrometers and irradiated for 1 minute under nitrogen, using the 500 w tungsten halogen lamp described in Example 1 at a distance of 250 mm to give a solid coating. The coated laminate is left in laboratory daylight, from which the ultraviolet portion is filtered out, for 1 week. The coating is then irradiated through a negative using a 5000 w metal halide lamp at a distance of 750 mm for 4 mins. Development in a 3:1 mixture of gamma butyrolactone and butyl digol produces a sharp negative image.

EXAMPLE 9

The mixture used in Example 5 is coated onto a copper clad laminate to a thickness of 30 micrometers. The coating is solidified by irradiation under nitrogen for 1 minute using the 500 w tungsten halogen lamp described in Example 1 at a distance of 200 mm. The solidified coating is left for storage in U.V. filtered laboratory light for 1 week. The coating is then irradiated through a negative using a 5000 w metal halide lamp at a distance of 750 mm for 5 minutes. Development in a 3:1 mixture of gamma-butyrolactone and butyl digol produces a negative image.

EXAMPLE 10

A mixture of Resin 1 and Resin 2 in the ratio of 65:35 (100 parts) is added to rose bengal (0.5 part), tri-n-butyl 4-methylbenzyl stannane (5 parts) and triphenylsulphonium hexafluorophosphate (5 parts). The resulting composition is coated onto a copper-clad laminate to a thickness of 30 micrometers and solidified by irradiation using the 500 w tungsten halogen lamp described in Example 1 at a distance of 250 mm for 3 minutes. The solidified coating is left exposed to ambient light, from which the ultra-violet light is filtered out, for 1 week. The coating is then exposed through a negative using a 5000 w metal halide lamp at a distance of 750 mm for 4 minutes. On development in a 3:1 mixture of gamma-butyrolactone and butyl digol a negative image is obtained.

EXAMPLE 11

Resin 1 (65 parts) and Resin 2 (35 parts) are mixed with dimethyltricyclo[3,3,1,1$^{3,7}$]decane-1-carbonylmethylsulphoxonium hexafluorophosphate (5 parts), benzil dimethyl ketal (3 parts) and acetone (1 part). The mixture is coated onto a copper clad laminate to a thickness of 30 micrometers. The coating is solidified by irradiation for 30 seconds at a distance of 750 mm using a 500 w metal halide lamp fitted with a plastic filter so that light of less than 300 nm is prevented from reaching the coating. The solidified coating is irradiated through a negative using the medium pressure mercury arc lamp described in Example 6 at a distance of 200 mm for two minutes. Development in a 3:1 mixture of gamma-butyrolactone and butyl digol produces a clear negative image.

EXAMPLE 12

Resin 1 (66 parts), Resin 2 (34 parts), Resin 7 (10 parts), triphenylsulphonium hexafluoroantimonate (10 parts), dimanganese decacarbonyl (5 parts) and 1,1,1-trichloroethane (2 parts) are mixed until homogeneous. The mixture is coated onto a copper-clad laminate to a thickness of 36 micrometers. The coating is solidified by irradiation under nitrogen using the 500 w tungsten halogen lamp described in Example 1 fitted with a filter to cut out radiation below 450 nm at a distance of 200 mm for 15 minutes. The solidified coating is then irradiated through a transparency using a 5000 w metal halide lamp at a distance of 750 mm for 5 minutes. Development in 1,1,1-trichloroethane with rubbing gives a negative image of the transparency.

EXAMPLE 13

Resin 8 (3 parts), Resin 9 (2 parts), bis(pi-methylcyclopentadienyl(bis(sigma 4-hexyloxy tetrafluorophenyl)titanium (IV) (0.05 part) and triphenylsulphonium hexafluoroantimonate (1 part) are mixed until homogeneous. The mixture is coated onto a copper clad laminate to a thickness of 36 micrometers. The coating is solidified by irradiation under nitrogen using the 500 w tungsten lamp as described in Example 1 at a distance of 200 mm for 30 seconds. The solidified coating in irradiated through a transparency using a 5000 w metal halide lamp at a distance of 750 mm for 2 minutes. The coating is then heated at 90° C. for 5 minutes and developed in a mixture of propylene carbonate (5 parts), butyl digol (3 parts) and gamma-butyrolactone (2 parts) to produce a negative image of the transparency.

EXAMPLE 14

A mixture of Resin 1 (21.5 parts), Resin 11 (50 parts), Resin 10 (25 parts), ethylene glycol bisthioglycolate (10 parts), benzil dimethyl ketal (2.5 parts) and dimethyltricyclo[3,3,1,1$^{3.7}$]decane-1-carbonylmethylsulphoxonium hexafluorophosphate (3.5 parts) is coated onto a copper clad laminate to a thickness of 30 micrometers. The coating is solidified by irradiating through a filter preventing light of less than 310 nm reaching the coating using a 5000 w metal halide lamp at a distance of 750 mm for 4 minutes. The solidified layer is exposed imagewise using the medium pressure mercury arc lamp described in Example 6 at a distance of 200 mm for 3 minutes. Development in a 3:1 mixture of gamma-butyrolactone and butyl digol produces a negative image.

What is claimed is:

1. A process for the production of an image which comprises:
   (1) applying to a substrate a layer of a liquid composition comprising:
   at least one first compound having a first group capable of polymerization upon exposure to visible or ultraviolet radiation, the first compound being selected from the group consisting of
   i) a compound having an ester containing at least one group of the formula

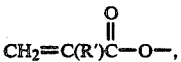

where R' is hydrogen, chlorine, bromine, or alkyl of 1 to 4 carbon atoms,
   ii) an allyl group-containing compound, and
   iii) a polymerizable mixture of at least one polyene-containing compound and at least one polythiol-containing compound;
   a first polymerization initiator which generates free radicals upon exposure to radiation at wavelengths selected from the visible region and ultraviolet region, the polymerization of the first groups being initiated by the free radicals generated from the first polymerization initiator;
   at least one second compound having a second group capable of polymerization upon exposure to actinic light having a wavelength shorter than required to initiate polymerization of said first group, the second compound selected from the group consisting of an epoxide resin, cyclic ether, vinyl ether, cyclic ester, cyclic sulfide, cyclic amine, and cyclic organosilicone; and
   a second polymerization radiation activatable catalyst selected from the group consisting of aromatic diazonium, sulfonium, iodonium, sulfoxonium salts and aromatic iodosyl salt;
   (2) irradiating the layer at wavelengths in the visible to ultraviolet region to effect solidification of said layer by the action of said first polymerization initiator on said first polymerizable groups without effecting polymerization of said second polymerizable groups;
   (3) thereafter irradiating the layer in a predetermined pattern with actinic radiation at said shorter wavelengths to effect polymerization of said second polymerizable groups in areas of the pattern so irradiated; and
   (4) removing those areas of the layer not so irradiated by said shorter wavelengths and in which said second polymerizable system has not been polymerized.

2. The process according to claim 1 wherein the polymerizable groups of said first polymerizable compound includes at least one group of the formula

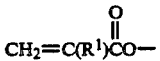

in which R$^1$ is hydrogen, chloro, bromo, or alkyl of 1 to 4 carbon atoms.

3. The process according to claim 1 wherein said first polymerizable compound includes a member selected from the group consisting of vinyl esters, allyl compounds, and vinyl heterocyclic compounds.

4. A process according to claim 1 wherein the first polymerizable compound is a mixture of a polyene with a polythiol in which the polyene has at least two groups of the formula

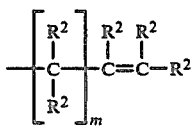

or

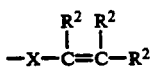

in which
each of the groups $R^2$ is the same or different and is hydrogen, fluoro, chloro, furyl, thienyl, pyridyl, unsubstituted or substituted phenyl, unsubstituted or substituted benzyl, unsubstituted or substituted alkyl, unsubstituted or substituted alkoxy of 1 to 9 carbon atoms, or unsubstituted or substituted cycloalkyl of 3 to 8 carbon atoms, said substituents being selected from the group consisting of chloro, fluoro, acetoxy, nitro, acetamido, phenyl, benzyl, alkyl, alkoxy, and cycloalkyl;
m is an integer of from 1 to 9; and
X is $-NR^2-$, $-O-$, or $-S-$;
and the polythiol has the formula

in which
$R^3$ is a polyvalent organic group free from reactive carbon-to-carbon unsaturation and n is at least 2.

5. A process as claimed in claim 1 wherein said first polymerization initiator is a benzoin ether, an acyloin ether, a halogenated alkyl or aryl derivative, an aromatic carbonyl derivative, a metallocene, a mixture of a group IVA organometallic compound with a photoreducible dye, a mixture of a quinone with an aliphatic amine having hydrogen attached to an aliphatic alpha carbon atom, an aliphatic dicarbonyl compound optionally mixed with an amine, a 3-ketocoumarin, an acyl phosphine oxide, a metal carbonyl, or a mixture of a photoreducible dye and a reducing agent.

6. A process as claimed in claim 5 wherein said first polymerization initiator is camphorquinone with a tertiary amine having a hydrogen atom attached to an aliphatic alpha carbon atom, biacetyl, dimanganese decacarbonyl, benzil dimethyl ketal, isobutyl benzoin ether, 2,2,2-trichloro-4'-tert.butylacetophenone, diethoxyacetophenone, a coumarin having a carbocyclic or heterocyclic aromatic ketone group in the 3-position, a mixture of a photoreducible dye with a stannane, a mixture of photoreducible dye with an electron donor, or a titanium metallocene.

7. A process according to claim 1 wherein said second polymerization compound contains photosensitive groups which are directly activatable by said shorter wavelength radiation.

8. A process according to claim 7 wherein said photosensitive groups include at least two azido, coumarin, stilbene, maleimido, pyridinone, chalcone, propenone, pentadienone, anthracene, or acrylic ester groups substituted in their 3-position by a group having ethylenic unsaturation or aromaticity in conjugation with an ethylenic double bond of the acrylic group.

9. a process as claimed in claim 1 wherein the second polymerizable system is an epoxide resin, a phenolic resin, a cyclic ether, a vinyl ether, a cyclic ester, a cyclic sulfide, a cyclic amine, or an organosilicon cyclic and said second polymerization initiator is a radiation-sensitive aromatic diazonium, sulfonium, iodonium, sulfoxonium or iodosyl salt.

10. A process according to claim 1 wherein the compound having said second polymerizable group is a diglycidyl ether of a dihydric phenol or alcohol, a polyglycidyl ether of a novolak, or a cycloaliphatic epoxide resin.

11. A process according to claim 1 wherein the weight ratio of the compound having the first polymerizable group to the compound having the second polymerizable group is from 1:0.1 to 1:10.

12. The process of claim 11 wherein the weight ratio is from 1:1 to 1:5.

13. The process of claim 1 wherein the first compound is said ester.

14. A process for the production of an image which comprises:
(1) applying to a substrate a layer of a liquid composition comprising:
at least one dual functional compound having a first group capable of polymerization upon exposure to visible or ultraviolet radiation and at least one epoxy group capable of polymerization upon exposure to actinic light having a wavelength shorter than required to initiate polymerization of said first group;
the first group is selected from the group consisting of
i) a group having the formula

where R' is hydrogen, chlorine, bromine, or alkyl of 1 to 4 carbon atoms,
ii) an allyl group, and
iii) a polymerizable mixture of at least one polyene group and at least one polythiol group;
a first polymerization initiator which generates free radicals upon exposure to radiation at wavelengths selected from the visible region and ultraviolet region, the polymerization of the first groups being initiated by the free radicals generated from the first polymerization initiator;
a radiation activatable catalyst for polymerization of the epoxy groups, the catalyst selected from the group consisting of aromatic diazonium, sulfonium, iodonium, sulfoxonium salts and aromatic iodosyl salt;
(2) irradiating the layer at wavelengths in the visible or ultraviolet region to effect solidification of said layer by the action of said first polymerization initiator on said first polymerizable groups without effecting polymerization of said second polymerizable groups;
(3) thereafter irradiating the layer in a predetermined pattern with actinic radiation at said shorter wavelengths to effect polymerization of said second polymerizable groups in areas of the pattern so irradiated; and
(4) removing those areas of the layer not so irradiated by said shorter wavelengths and in which said second polymerizable system has not been polymerized.

15. A process according to claim 14 wherein the polymerizable groups comprising said first and second polymerizable groups are present on a common molecule selected from the group consisting of (i) an ester of an ethylenically unsaturated monocarboxylic acid with an epoxide group, (ii) a compound containing both an ethylenically unsaturated carboxylic ester group and an anthryl group, and (iii) a compound containing both an epoxide group and an allyl or methallyl group.

16. A process for the production of an image which comprises:
(1) applying to a substrate a layer of a liquid composition consisting essentially of:
at least one first compound capable of polymerization upon exposure to visible or ultraviolet radiation, the first compound being selected from the group consisting of
i) a compound having an ester containing at least one group of the formula

where R' is hydrogen, chloro, bromo, or alkyl of 1 to 4 carbon atoms,
ii) an allyl group-containing compound, and
iii) a polymerizable mixture of at least one polyene-containing compound and at least one polythiol-containing compound;
a first polymerization initiator which generates free radicals upon exposure to radiation at a first wavelength in the visible region to ultraviolet region, the polymerization of the first compound being initiated by the free radicals generated from the first polymerization initiator;
at least one second compound wherein polymerization is activated upon exposure to actinic light of a different and a shorter wavelength than that required to initiate polymerization of said first compound, the second compound being selected from the group consisting of an epoxide resin, cylic ether, vinyl ether, cyclic ester, cyclic sulfide, cyclic amine, and cyclic organosilicone, the weight ratio of the first compound to the second compound being from 1:0.1 to 1:10; and
a second radiation activatable polymerization catalyst selected from the group consisting of aromatic diazonium, sulfonium, iodonium, sulfoxonium salts and aromatic iodosyl salt;
(2) irradiating the layer at the first wavelength in the visible to ultraviolet region operable to effect solidification of said layer by the action of said first polymerization initiator on said first compound, but not operable to polymerize said second compound;
(3) thereafter irradiating the layer in a predetermined pattern with actinic radiation at a wavelength shorter than the first wavelength and operable to polymerize said second compound in areas of the pattern so irradiated; and
(4) removing those areas of the layer in which the second polymerizable compound has not been polymerized.

17. The process is recited in claim 16, where the first compound is selected from the group consisting of 2,2-bis(4-(3-acryloyloxy-2-hydroxypropoxy)phenyl)propane; tris(3-mercapto-2-hydroxypropyl)ether of polypropylene triol; 2,2-bis(4-vinyloxyethoxy phenyl)propane; trimethylol-propane trismethacrylate; 2-hydroxyethyl methacrylate; trimethylol-propane trisacrylate; and mixtures thereof; and
the second compound is selected from the group consisting of epoxidised o-cresol novolak; 1,4-bis(3,4-epoxycyclohexylmethyl)butane dicarboxylate; 3,4-epoxy cyclohexylmethyl 3',4'-epoxycyclohexane carboxylate; 2-hydroxy-3-methacryloyloxypropyl anthracene-9-carboxylate; and mixtures thereof.

* * * * *